(12) United States Patent
Ivie

(10) Patent No.: US 7,769,728 B2
(45) Date of Patent: Aug. 3, 2010

(54) METHOD AND SYSTEM FOR INTRA-ROW, INTER-ROW COMPRESSION AND DECOMPRESSION OF DATA ITEMS IN A DATABASE USING A PAGE-BASED STRUCTURE WHERE ALLOCATING A PAGE-BUFFER BASED ON A STORED VALUE INDICATING THE PAGE SIZE

(76) Inventor: James R. Ivie, 414 N. 600 East, Lindon, UT (US) 84042

( * ) Notice: Subject to any disclaimer, the term of this patent is extended or adjusted under 35 U.S.C. 154(b) by 1103 days.

(21) Appl. No.: 11/294,943

(22) Filed: Dec. 6, 2005

(65) Prior Publication Data

US 2006/0123035 A1 Jun. 8, 2006

Related U.S. Application Data

(60) Provisional application No. 60/633,859, filed on Dec. 6, 2004.

(51) Int. Cl.
*G06F 17/00* (2006.01)
*G06F 17/30* (2006.01)
(52) U.S. Cl. .................. 707/693; 707/609; 707/797; 707/801
(58) Field of Classification Search ............ 707/1–2, 707/100–101, 103 R, 200, 205, 103 Y, 609, 707/693, 796–797, 800–801, 812; 704/7, 704/256–256.4; 382/166, 232–233; 380/216–217; 348/14.13
See application file for complete search history.

(56) References Cited

U.S. PATENT DOCUMENTS 5,668,897 A * 9/1997 Stolfo .................. 382/283

5,794,228 A * 8/1998 French et al. ............. 707/2
5,794,229 A * 8/1998 French et al. ............. 707/2

(Continued)

FOREIGN PATENT DOCUMENTS

WO    WO 93/12481    * 6/1993

(Continued)

OTHER PUBLICATIONS

Zhiyuan Chen et al. "Query Optimization in Compressed Database Systems",ACM SIGMOD May 21-24, 2001 Santa Barbara, California, USA, 12 pages.*

(Continued)

*Primary Examiner*—Srirama Channavajjala
(74) *Attorney, Agent, or Firm*—Jeffery M. Lillywhite, PC

(57) ABSTRACT

A database compression system includes a compression plug-in that allows a database to be compressed using multiple compression algorithms. As well, implementations of the present; invention allow inter-row compression to be used with fixed-page sizes in a page-based database. For example, the compression plug-in inter-row decompresses a requested page from sub-storage, and allocates a page buffer that corresponds at least to the size of the page data when inter-row decompressed. The compression plug-in then adds data to the page buffer using intra-row compression, such as gamma compression. When the page data is no longer needed, the compression plug-in compresses the page data using inter-row compression, and passes the compressed page data from the page buffer to the corresponding page, which is fixed in size, in sub-storage.

9 Claims, 5 Drawing Sheets

U.S. PATENT DOCUMENTS

| | | | |
|---|---|---|---|
| 5,805,086 A * | 9/1998 | Brown et al. | 341/51 |
| 5,918,225 A | 6/1999 | White et al. | |
| 6,092,070 A * | 7/2000 | Belcea | 707/101 |
| 6,202,136 B1 | 3/2001 | Wikle et al. | |
| 6,301,394 B1 * | 10/2001 | Trout | 382/244 |
| 6,411,295 B1 * | 6/2002 | Hung et al. | 345/422 |
| 6,523,102 B1 * | 2/2003 | Dye et al. | 711/170 |
| 6,618,728 B1 * | 9/2003 | Rail | 707/101 |
| 6,782,136 B1 * | 8/2004 | Lerner et al. | 382/240 |
| 6,857,045 B2 * | 2/2005 | Galbraith et al. | 711/118 |
| 6,947,944 B1 * | 9/2005 | Furuike | 707/101 |
| 7,047,421 B2 * | 5/2006 | Benaloh | 713/193 |
| 7,171,427 B2 * | 1/2007 | Witkowski et al. | 707/104.1 |
| 2003/0204513 A1 * | 10/2003 | Bumbulis | 707/100 |
| 2005/0065910 A1 * | 3/2005 | Welton et al. | 707/2 |

FOREIGN PATENT DOCUMENTS

| | | | |
|---|---|---|---|
| WO | WO 97/23828 | * | 7/1997 |
| WO | WO 01/80016 | * | 10/2001 |
| WO | WO 2006/009616 | * | 1/2006 |
| WO | WO 2006/063057 | * | 6/2006 |
| WO | WO 2007/065300 | * | 6/2007 |

OTHER PUBLICATIONS

M. Kjelsù et al. "Performance evaluation of computer architectures with main memory data compression", Journal of Systems Architecture 45 (1999) 571±590.*

* cited by examiner

METHOD AND SYSTEM FOR INTRA-ROW, INTER-ROW COMPRESSION AND DECOMPRESSION OF DATA ITEMS IN A DATABASE USING A PAGE-BASED STRUCTURE WHERE ALLOCATING A PAGE-BUFFER BASED ON A STORED VALUE INDICATING THE PAGE SIZE

RELATED APPLICATIONS

This application claims the benefit and priority of U.S. Provisional Patent Application Ser. No. 60/633,859, filed Dec. 6, 2004, entitled "APPLYING MULTIPLE COMPRESSION ALGORITHMS IN A DATABASE SYSTEM", the disclosure of said application is incorporated herein by this reference.

BACKGROUND OF THE INVENTION

1. The Field of the Invention

This invention relates to systems, methods, and computer program products for compressing data in a database system.

2. Background and Relevant Art

Many conventional database systems use "B-Trees", or some other similar "page"-based structure to store collections of structured data. One reason for this is that B-Tree systems generally provide efficient methods to store and access large amounts of dynamic data on slow media, such as tape or hard disk ("sub-storage"). Data such as this is typically more data than would ordinarily fit in Random Access Memory ("RAM") To enable this level of efficiency, however, B-Tree systems make no assumption about what type of data is being stored, allowing the B-Tree systems to be flexible enough for most kinds of data. In particular, B-Tree systems generally limit the data to "tables" where each item is stored a row, with its elements stored in columns (the set of columns being the same for all items in the table). Each column is defined to contain a fixed size number or a string (either of a fixed size or of variable size).

As computer CPUs increase in performance relative to disk systems, the relative cost of using variable-sized columns, and compression, has fallen. In general, compression algorithms remove redundancy in data, thus making the data smaller. This is generally desirable since storing the original version of the data on disk often takes longer than it takes to both compress the data and store the smaller or compressed version of the data on disk. A number of different types of compression have been implemented to remove redundancy in data to provide such storage efficiencies. For example, compression can shrink the column data before it is put into the columns (i.e., "intra-row" compression), such as if the table system supports the type of data that is being put in, and is still able to sort the rows. In another exemplary system, compression is utilized to shrink the size of the resulting pages (i.e., "inter-row" compression). Unfortunately, neither of these compression systems is ideal in conventional databases.

By way of explanation, "intra-row" compression involves applying compression before the values are entered into columns, since the compression works within a single row. Unfortunately, the storage savings from intra-row compression are minimal since most of the data redundancy in a page-based database is between the rows in a table, not within the rows. By contrast, "inter-row" compression, or compression of several rows in a table, results in much better compression, but results in chunks of data that are of different sizes (i.e., each page started out the same size but the compression works differently on each one, resulting in different sizes). Since "inter-row" compression results in chunks of data that vary in size, inter-row compression is generally used with a sub-storage that supports storage and retrieval of variable-sized data. Unfortunately, compressing to variable-sized data chunks, such as with inter-row compression, can result in significant performance degradation. In particular, much of the space savings offered by inter-row compression is wasted by the sub-storage system as the sub-storage tries to compensate for having to support variable-sized chunks.

One example of a conventional inter-row compression system in a database is a database that uses a "symbol table". In particular, a database system such as this looks for common values for each column, and only stores one version of that value in the symbol table, which is also stored in the same page. The symbol table refers back to that value whenever the value occurs again in columns stored in the same page. As such, this type of compression is an example of inter-row compression, since the compression works by looking at values common in more than one row in the table. The problem of variable-sized chunks of data is solved by applying the compression as the items are placed into the pages.

An example of intra-row compression, called "gamma" encoding, includes one type of a full-text indexing system. For example, a full-text indexing system that uses gamma encoding may assume that smaller numbers are used much more frequently than large ones. The system then stores numbers with a variable number of bytes, where small numbers only take a small number of bytes, and large numbers take more bytes (even more than their corresponding normal fixed-width representation). Where the smaller numbers are represented more frequently in the indexing system, the gamma encoding can provide measurable space savings.

Another example of an inter-row compression algorithm is a "delta" (.i e.; difference) compression, which uses the delta, or difference, between rows to identify data. This type of compression is sometimes used to store databases, such as one used to store a dictionary in as small a space as possible, where many of the data terms have at least some similarity. In particular, a delta compression algorithm takes advantage of the fact that words in the dictionary, when stored in order, frequently start with a sequence of letters identical to the previous word in the list. For example, after "rabbi", the next word in the dictionary might be "rabbit". The word "rabbit" could be stored represented as "5t", indicating that the first 5 letters of this word are the same as in the previous word, but then adds the letter "t" to the end.

Unfortunately, conventional databases do not take advantage of the different types of compression algorithms, and tend to use only one type of compression or another. One reason that this might be is that compression algorithms that result in smaller data also result in data that cannot typically be read or modified without decompressing or recompressing the entire data set. Since large sets of data are frequently subject to change due to the addition of new data, such a system of multiple compression algorithms does not work well. In particular, the accessibility and modifiability of the data is important, but are nevertheless subject to the need for smaller data sizes to accommodate very large databases.

For example, a database index using a B-Tree system might store the word "zoo", but then use a separate (non page-base) data stream to store the corresponding list of rows that the word "zoo" exists in, using delta compression (storing only the difference between numbers in an increasing sequence) and gamma compression (storing smaller numbers using less bytes). This could provide size savings advantage, but nevertheless require a separate system for storing the data stream containing the list of rows, since the data could not be stored in the B-Tree. For example, a database utilizing this type of design might only be able to update the index (for example, removing a document from the system) by completely rewriting the index stream. As such, this type of database makes modifications to the database very cumbersome as a trade off for space gains from compression.

Accordingly, an advantage in the art can be realized with systems, methods, and computer program products that efficiently combine the benefits of several compression algorithms into a single database system, while retaining the system's ability to efficiently make incremental changes to the data.

BRIEF SUMMARY OF THE INVENTION

The present invention solves one or more of the foregoing problems in the prior art with database systems and methods that provide for the efficient use of multiple compression algorithms in a way that data can be compressed for significant space savings, and can be easily retrieved and read when needed. In particular, implementations of the present invention provide for the efficient use of both intra-row and inter-row compression techniques in a database system using a page-based structure and a compression plug-in which facilitates access to data from the page based structure and writing of new data into sub storage in an efficient manner.

For example, in one implementation of the present invention, a request is received to access (i.e., add, delete, modify) data contained within a database page. A compression plug-in retrieves the database page from sub-storage, allocates a page buffer based on a stored value indicating the page size when inter-row decompressed, and then inter-row decompresses the page into that page buffer. The page data, however, remains in intra-row compressed form within the page buffer; and any data added to the page buffer is added using intra-row compression techniques, such as gamma encoding.

Once the page data is no longer needed, the data in the page buffer can be saved back to the sub-storage. To do this, the compression plug-in begins by compressing the data in the page buffer using inter-row compression. The compression plug-in identifies if there is sufficient space in the page in sub storage to store the data in the page buffer. If there is sufficient space to store the intra-row and inter-row compressed data from the page buffer to the page in sub-storage, the compressed data from the page buffer is saved into the page in the sub-storage. If there is too much data to fit into the page in the sub-storage, the page buffer is split into one or more additional page buffers, as appropriate, and one or more corresponding fixed-size pages are also created in the sub-storage. The compression plug-in then inter-row compresses each page buffer and writes the compressed data into the corresponding fixed-size pages in the sub-storage.

According to one embodiment of the present invention, the compression plug-in is utilized to allocate the page buffer, access data from sub-storage, manage compression of data to and from sub-storage, and allocate new page buffers and pages in sub-storage as required, and inform the B-Tree or other row management system of the addition of new pages as a result of a page buffer split. Utilizing the compression plug-in for such functionality provides a number of benefits. The compression format can be changed, altered, or dynamically customized according to the type of underlying data to be stored without affecting the underlying storage format or row management system. Additionally, the compression plug-in facilitates the determination of the need to create additional pages in sub-storage without first attempting to write the data into sub-storage. The use of a compression plug-in also allows an underlying B-Tree or other data storage structure to maintain the data in fixed size pages in sub-storage. By utilizing fixed size pages in sub-storage, optimal efficiency of the underlying storage format is maintained as new pages in sub-storage are created to accommodate additional data being written from page buffers.

Accordingly, implementations such as these in accordance with the present invention provide the ability to custom-tailor multiple types of compression for each data type being stored, while retaining fixed-size pages in sub-storage. Furthermore, implementations in accordance with the present invention provides these advantages without necessarily requiring any changes to the B-Tree (or other row management) system. Furthermore such implementations provide the ability to maintain an acceptable level of accessibility and modifiability in the database system.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention extends to systems and methods that provide for the efficient use of multiple compression algorithms in a way that data can be compressed for significant space savings, and can be easily retrieved and read when needed. In particular, implementations of the present invention provide for the efficient use of both intra-row and inter-row compression techniques in a database system using a page-based structure and a compression plug-in which facilitates access to data from the page based structure and writing of new data into sub storage in an efficient manner.

By applying compression using a plug-in while the data is being added to the pages, the present invention can separate compression from both the sub-storage and the row management system, and thus balance saving space with accessibility and modifiability. Additionally, the compression plug-in facilitates the determination of the need to create additional pages in sub-storage without first attempting to write the data into sub-storage. Due to the inherent inefficiencies of transferring data to sub-storage, utilizing a compression plug-in to determine whether there is sufficient space in the page before transferring data to sub-storage results in substantial performance efficiencies.

Figure 1:
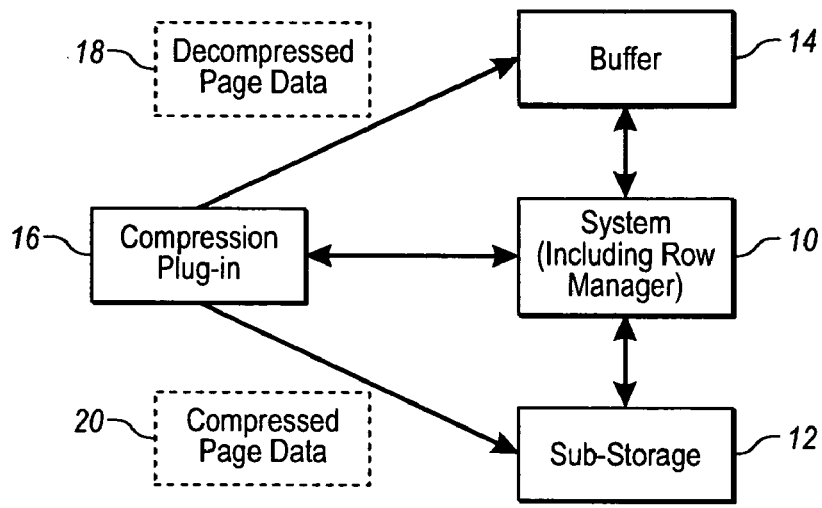
FIG. 1 is a block diagram of an illustrative system utilizing a compression plug-in to control access and storage of new data into sub-storage according to one embodiment of the present invention.

FIG. 1 is a block diagram of an illustrative system utilizing a compression plug-in to control access and transfer of data to and from sub-storage according to one embodiment of the present invention. In the illustrated embodiment, a system 10 is provided between sub-storage 12 and a buffer 14. In the illustrated embodiment, system 10 is operably linked to sub-storage 12 and buffer 14 such that page data can be accessed from sub-storage 12 for the addition of data into the page in sub-storage 12. For example, according to one embodiment of the present invention, information in a page in sub-storage 12 corresponds with information stored in a database. In the event that additional data needs to be added to the database, the page corresponding with the information to be stored is accessed from sub-storage 12. The page data in sub-storage 12 is compressed for efficient storage of the page data in the underlying storage format (i.e. B-Tree data structures). The page data accessed from sub-storage 12 is at least partially decompressed and sent to buffer 14. The data is stored in buffer 14 allowing the new data to be added to the page data as appropriate.

In the illustrated embodiment, a compression plug-in 16 is provided in connection with system 10. Compression plug-in 16 provides compression and decompression of data. Compression plug-in 16 controls access of page data from sub-storage 12 including providing decompression of page data being accessed from sub-storage 12. Additionally, compression plug-in allocates buffer 14 for data transferred from sub-storage 12 including providing transmission of decompressed data to page buffer 14. Compression plug-in 16 also facilitates management of system 10, including the row manager, allowing for compression of new data being added to buffer 14. In the illustrated embodiment, decompressed page data 18 accessed from sub-storage 12 is provided to buffer 14 utilizing compression plug-in 16. Subsequent to the addition of new data from system 10 to buffer 14, compression plug-in 16 facilitates compression of the data in buffer 14 for storage in sub-storage 12. Compression plug-in 16 then transmits compressed page data 20 from buffer 14 into sub-storage 12.

By applying compression using compression plug-in 16 while the data is being added to the pages used by the row management system, the present invention can separate the compression from both sub-storage 12 and the row management system of system 10, and thus balance saving space with accessibility and modifiability. The balance needed for each data type may be different. Thus, compression plug-in 16 allows for changing of the compression algorithm, without the changing underlying row management or sub-storage systems, providing the ideal balance between compression and modifiability for each type of data that the system stores, without necessarily requiring modification of the underlying systems. In accordance with the present invention, compression plug-in 16 can be configured for use with any traditional B-Trees, B+Trees, B*Trees, Binary Trees, N-way Trees, Database Tables, Hash-Trees, or any other page-based storage system, with little modification, and without affecting the system's ability to decide on what pages data should be stored.

Figure 2:
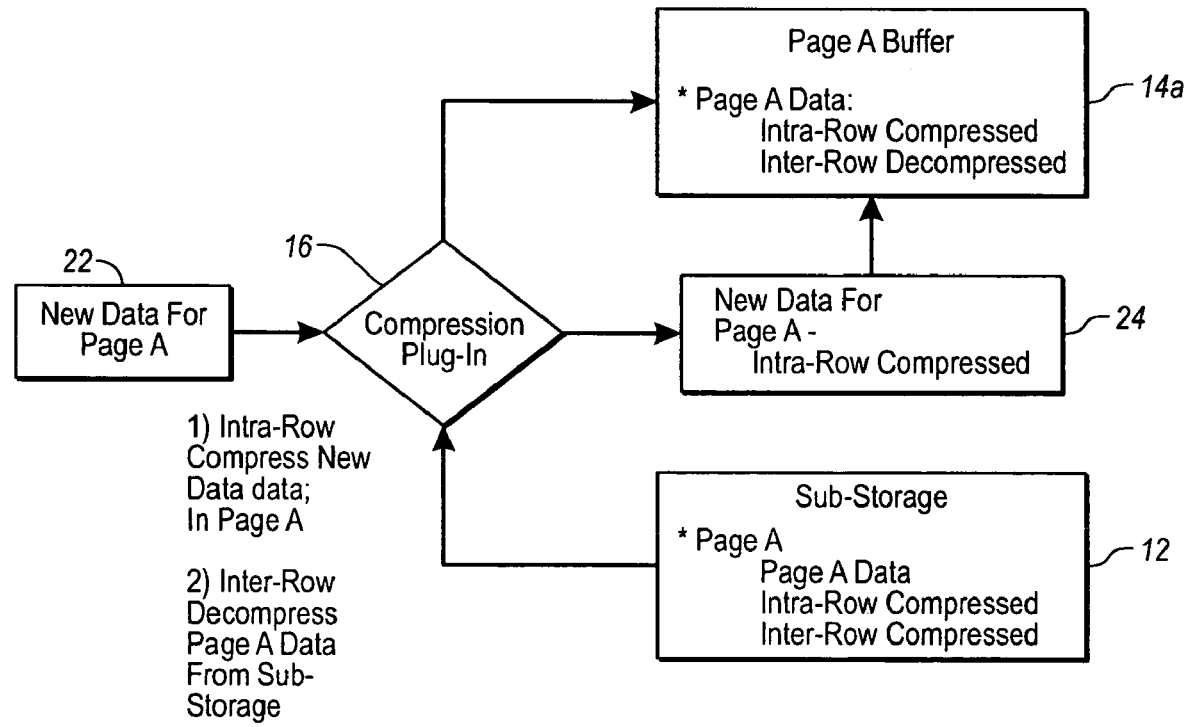
FIG. 2 illustrates the manner in which the compression plug-in of FIG. 1 is utilized to access data from sub-storage and utilize a page buffer to add new data to the page data.

FIG. 2 illustrates the manner in which compression plug-in 16 is utilized to access data from sub-storage 12 and utilize Page A Buffer 14a to add new data. In the illustrated embodiment, system 10 loads a page (i.e. Page A) and the corresponding data (i.e. Page A Data) from the sub-storage 12. Compression plug-in 16 creates a corresponding Page A Buffer 14a that is larger than the data loaded from sub-storage 12. According to one embodiment of the present invention, the data in sub-storage 12 (i.e. Page A Data) is compressed in both intra-row compression and inter-row compression. The compression plug-in 16 provides inter-row decompression of the data from sub-storage 12 while leaving the data in intra-row compression. The larger size of Page A Buffer 14a is used to store a version of the intra-row compressed data (i.e. Page A data in Page A Buffer 14a).

New data 22 to be added to Page A data in Page A Buffer 14a is provided in connection with compression plug-in 16. Before new items are added to the page data in Page A Buffer 14a, compression plug-in 16 applies intra-row compression to the new data to resulting in intra-row compressed new data 24. Compression plug-in 16 operates in connection with a row manager to determine the juxtaposition of the new data 24 relevant to the existing page data in Page A Buffer 14a. Compression plug-in 16 then inserts the new data into Page A Buffer 14a (expanding Page A Buffer 14a if needed).

As will be appreciated by those skilled in the art, a variety of types and configurations of systems and methods can be provided without departing from the scope and spirit of the present invention. For example, according to one embodiment of the present invention, the compression plug-in operates in connection with the row manager before intra-row compression of the data. In another embodiment, the compression plug-in compresses the page data independent of the row manager and subsequently the row manager adds the intra-row compressed data in the page buffer without the use of the compression plug-in. According to another embodiment of the present invention, the data from sub-storage is completely decompressed before addition to the page buffer. According to another embodiment of the present invention, the data in sub-storage is compressed with a single compression algorithm (such as index compression) and the compression plug-in is utilized to control the addition of new data into the sub-storage in the single compression format.

Figure 3:
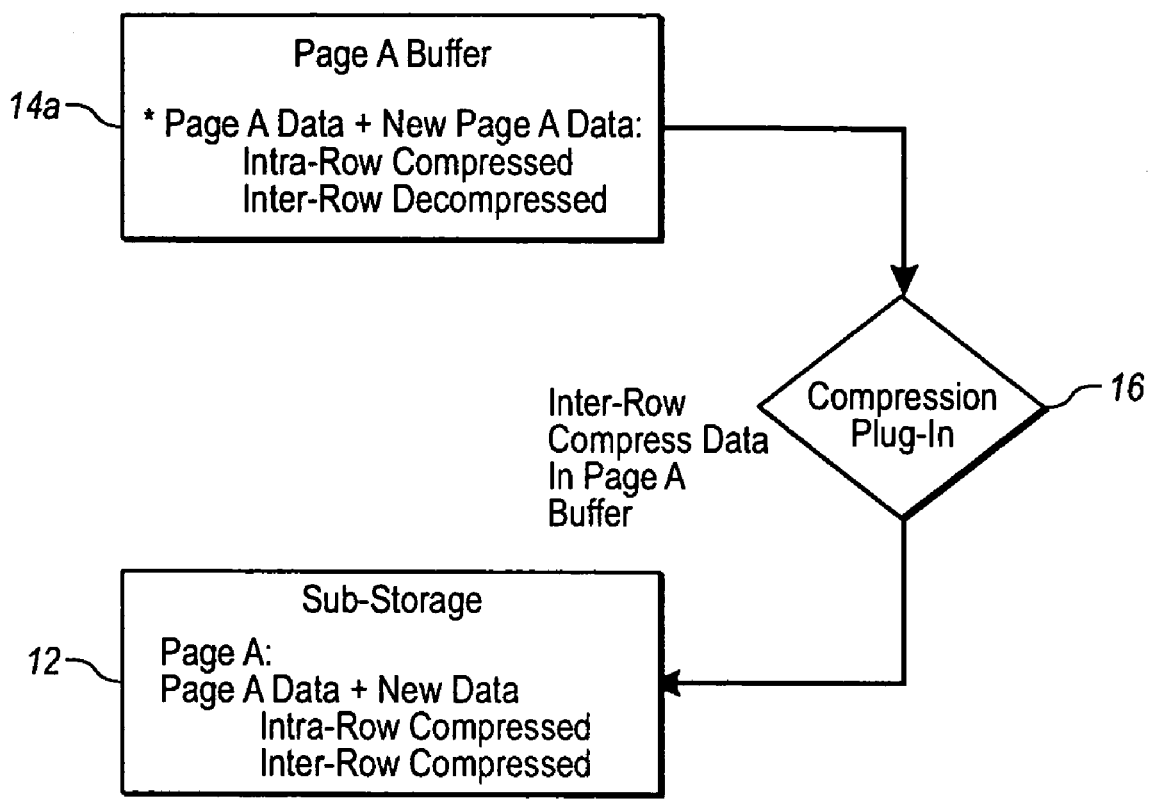
FIG. 3 illustrates the manner in which data is transferred from the page buffer to sub-storage utilizing the compression plug-in of FIG. 1.

FIG. 3 illustrates the manner in which data is written from page buffer 14 to sub-storage 12 utilizing compression plug-in 16. In the illustrated embodiment, subsequent to the addition of new data to page buffer 14, page buffer 14 contains the original data inter-row decompressed from sub-storage 12

(i.e. Page A Data) plus the new data intra-row compressed from compression plug-in 16 (i.e. New Page A Data). Once the new data has been added to page buffer 14, compression plug-in 16 identifies that the data in page buffer 14 is ready to be sent to sub-storage 12.

When the data in page buffer 14 is ready to be moved back to the sub-storage 12, compression plug-in 16 then applies inter-row compression to both the Page A Data and the New Page A Data. Such inter-row compression can include delta-row compression or other known inter-row compression algorithms. Because, the data in page buffer 14 was stored in intra-row compression, the additional inter-row compression provided by compression plug-in 16 results in both intra-row and inter-row compression of the data from page buffer 14. The compressed page data from page buffer 14, including the new page data, is then sent to a page in sub-storage 12 corresponding with page buffer 14. Subsequent to transmission of the data from compression plug-in 16 to sub-storage 12, the data is stored in sub-storage 12 in both an intra-row compressed and inter-row compressed format. This provides compression benefits of inter-row compression while maintaining fixed sized bits of data that allows for optimized accessibility, modifiability, and overall system performance.

In accordance with the present invention, although traditionally-structured data can benefit from this type of compression, index data can also benefit greatly. For example, traditional SQL databases use B-Trees to index data stored in tables. One of the most complicated (and space-consuming) indexes in a database is a full-text index. In a full-text index, every word from every document in the table is indexed so that by looking up the word in the B-Tree, one can quickly find which documents have that particular word in them. In a traditional database, this data is enormous since each entry in the index stores the word, a document identifier, and a position within the document where that word occurs. For example, a typical full-text index might be represented as follows:

| Word | Document | Position |
|---|---|---|
| zoological | 5789 | 2625 |
| zoological | 5789 | 2652 |
| zoological | 5789 | 2731 |
| zoological | 5789 | 2788 |
| zoological | 88764 | 10 |
| zoological | 88764 | 66 |
| zoological | 88764 | 82 |
| zoological | 9947852 | 43 |

Each of the entries in this table account for the fact that there might be many documents and some documents may be very long. As such, the fields used to store the document identifier, and the position information must be large enough to indicate the last possible word in the last possible document in the system. Thus, in the example given above, 32 bits would be needed to store the document identifier, and 16 bits would be needed to store the position (though this would limit the documents to 65536 words). As such, a total of (at least) 17 bytes would be needed for each row of data (11 bytes for the string "zoological" and a terminator or length indicator, 4 bytes for the document identifier, and 2 bytes for the position information), for a total of 136 bytes.

f one conventional inter-row compression is used on the above table, any values used more than once in the page (i.e., the string "zoological" and the document identifiers 5789 and 88764) could be reduced to a single instance, plus one byte (or more) per instance. This would reduce the total size to 17 (first row)+8 (each instance of "zoological")+4 (5789)+4 (each instance of 5789)+4 (88764)+3 (each instance of 88764)+4 (9947852)+8*2 (positions), for a total of 60 bytes.

By contrast, implementations of the present invention provide for storage of all of the page data in the B-Tree database system while using three compression algorithms. As such, "zoological" is only stored once, each unique document identifier is only stored once, and both the document identifiers and the positions of the page data are stored using only the increase from the previous item. Furthermore, the present system uses gamma encoding to store small numbers with fewer bytes.

As such, using a simplified version of a compression scheme in accordance with the present invention, this sample data might require only 11 ("zoological")+2 (5789 gamma encoded)+2 (2652 gamma encoded)+1 ("zoological" and 5789 repeat indicator)+1 (2752–2725 gamma encoded)+1 ("zoological" and 5789 repeat indicator)+1 (2731–2652 gamma encoded)+1 ("zoological" and 5789 repeat indicator)+1 (2788–2731 gamma encoded)+1 ("zoological" repeat indicator)+3 (88764–5789 gamma encoded)+1 (10 gamma encoded)+1 ("zoological" and 88476 repeat indicator)+1 (66–10 gamma encoded)+1 ("zoological" and 88476 repeat indicator)+1 (82–66 gamma encoded)+4 (9947852 - 88764 gamma encoded)+1 (43 gamma encoded), or 35 bytes. This results in a compression ratio of 136:35, or 3.89. Nevertheless, even less space than this might be needed since a code to indicate that the column value is the same as in the previous row could be implemented in a way that takes up less than one byte of space. If the sample data contained more entries for "zoological" (as would be likely with both large data sets and more common words), the compression ratio could improve significantly.

While 35 bytes is slightly more space (i.e., less compression) than the compression provided in some conventional non-paged compression systems, such systems usually require decompressing and recompressing larger amounts of data when modifying small portions of existing data, which requires more accesses to sub-storage, resulting in a system that is slower overall. However, the present system uses the same system for all types of page data, and retains significantly more modifiability than the compression systems that provide slightly more compression (compression only needs to be reapplied to a single page worth of items to insert or delete one row). As a result, any loss in compression is more than compensated for in improved system performance resulting from the ability to modify the data without recompressing the entire data set. Such efficiencies are particularly magnified where the system is utilized with very large data sets (e.g., tables of millions of documents averaging 30,000 or more words).

Figure 4:
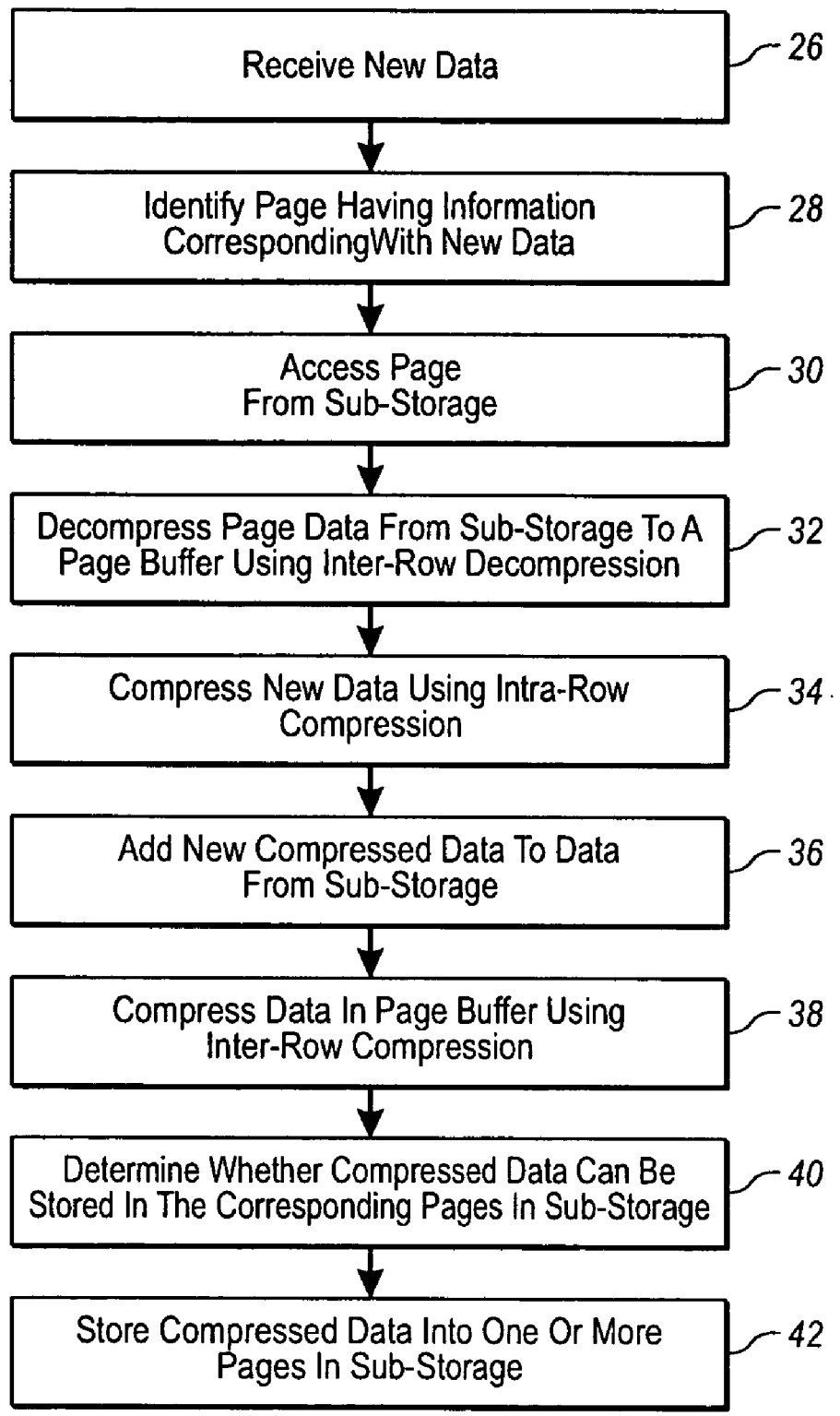
FIG. 4 is a flow diagram illustrating the manner in which a compression plug-in transfers new data for storage in sub-storage according to one embodiment of the present invention.

FIG. 4 is a flow diagram illustrating the manner in which a compression plug-in is utilized to insert new data into sub-storage according to one embodiment of the present invention.. In the illustrate embodiment, new data is received in step 26. Subsequent to receiving data, a page in sub-storage having data corresponding with the new data is identified in step 26. The page and corresponding data is then accessed from sub-storage in step 28. Once the page and corresponding data have been accessed from sub-storage, the page data is decompressed using inter-row decompression and sent to a page buffer corresponding with the page in step 32.

Once the inter-row decompressed data has been sent to the page buffer, the new data is compressed using intra-row compression in step 34. The new data compressed using intra-row compression is then added to the inter-row decompressed data in the page buffer in step 36. Once the new data has been added to the inter-row decompressed data, the data in the page buffer is compressed using inter-row compression in step 38. It is then determined whether the compressed data can be stored in the corresponding page in sub-storage in step 40. In the event that it is determined that the compressed data can be stored in the corresponding page in sub-storage, the inter-row compressed data is then stored in the corresponding page in sub-storage in step 42.

The compression plug-in is configured to determine, before attempting to write the data from the page buffer to the page in the sub-storage corresponding with the page buffer, whether there is sufficient space in the page in sub-storage to accommodate the data from the page buffer. In the event, that there is sufficient space in the page in sub-storage corresponding with the page buffer, the data is stored in the page in sub-storage. In the event that there is insufficient space in the page in sub-storage, additional space is allocated to store the information in sub-storage before attempting to store the data in sub-storage.

Figure 5:
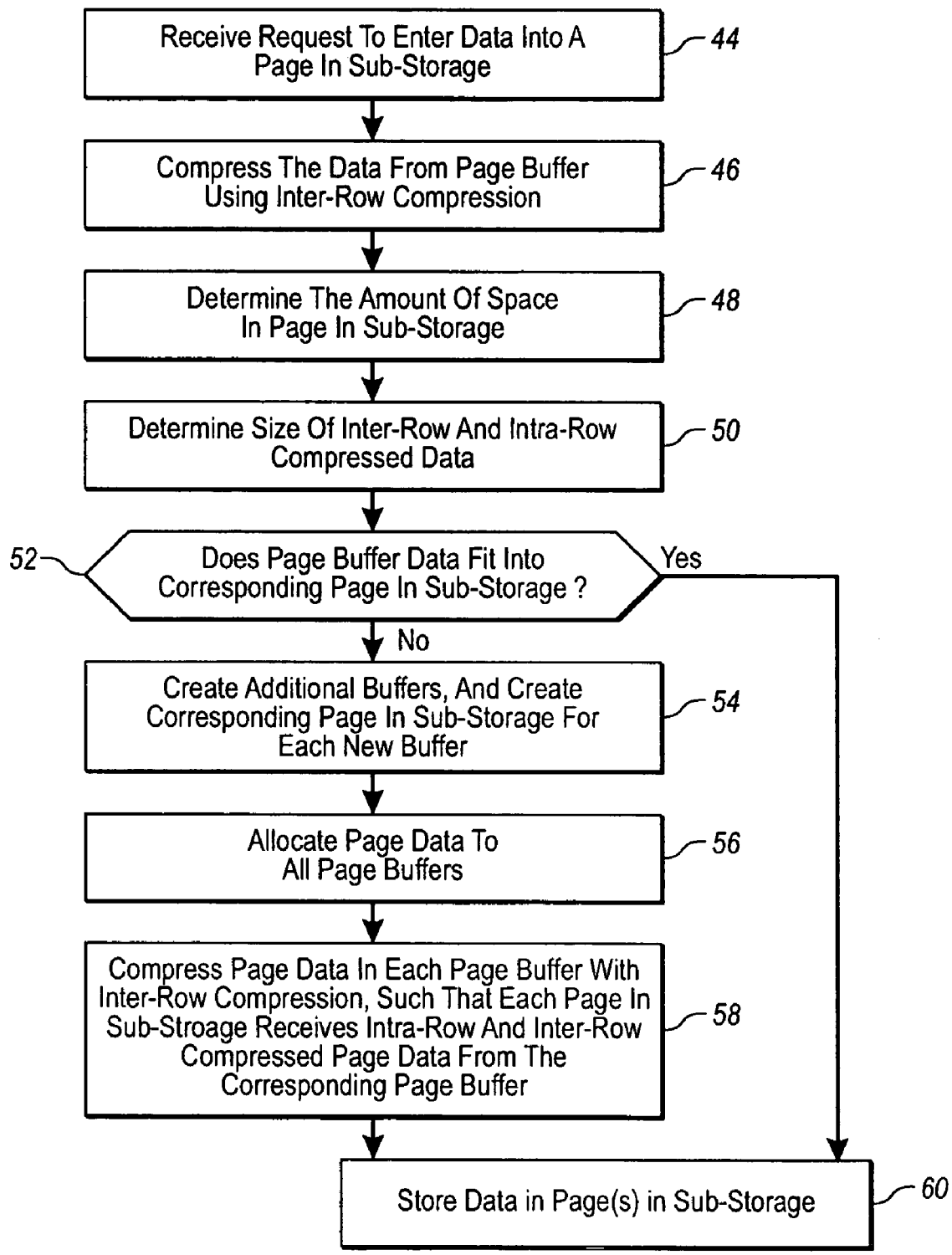
FIG. 5 is a flow diagram illustrating the manner in which the compression plug-in determines whether to create additional pages within sub-storage for transferring data to sub-storage.

FIG. 5 illustrates a method utilized to allocate additional space for the storage of the data from the page buffer before attempting to store the data in sub-storage according to one embodiment of the present invention. In the illustrated embodiment, a request is received to enter data from a page buffer in which additional data has been added into a page in sub-storage in step 44. After receiving the request to enter the data into a page in sub-storage, the data from the page buffer is compressed using inter-row compression in step 46. The amount of space provided by the page in sub-storage is then determined in step 48. Once the amount of space provided by the page in sub-storage is determined, the size of the intra-row and inter-row compressed data is determined in step 50.

It is then identified whether compressed data from the page buffer will fit into the corresponding page in sub-storage in step 52. If there is sufficient space in the page in sub-storage corresponding with the page buffer, data is saved in a page of sub-storage in step 60. If there is insufficient space in the page in sub-storage corresponding with the page buffer, additional buffers and pages in sub-storage are created to accommodate the amount of compressed data in step 54. The compressed data is decompressed using inter-row decompression and then allocated to the page buffers in step 56. Once the data has been allocated to the additional page buffers, the data from each individual page buffer is compressed using inter-row compression and sent to the respective pages in sub-storage such that each page receives inter-row compressed page data from their respective page buffers in step 58.

Due to the amount of time that is required to write data to sub-storage, the determination of the sufficiency of space on the page(s) in sub-storage performed by the compression plug-in, provides significant performance savings in the data storage system. In the event that the amount of new-data that has been added to the page buffer renders the resulting data too large to store in the page in sub-storage, the attempt to write that data to the page in sub-storage results in significant consumption of system operating time. The data is retrieved from sub-storage, decompressed, split into additional page buffers, and then re-written to storage. By first determining whether there is sufficient space in the page in sub-storage before attempting to write data to sub-storage, significant operating efficiencies are provided. While not every addition of data to a page buffer renders the resulting data too large to store in the existing page in sub-storage, determination of the amount of space provided by the page in sub-storage still provides significant operating efficiencies. System operating speed allows the compression plug-in to perform a significant number of sub-storage space determinations in less time than it takes to make a single attempt to transfer page data from the page buffer to sub-storage.

As will be appreciated by those skilled in the art, a variety of types and configurations of systems and methods for allocating page buffer data to additional pages in sub-storage can be utilized. For example, in one embodiment, the compression plug-in utilizes the row-management system to allocate data into multiple page buffers once it is determined that there is insufficient space in the page(s) in sub-storage to accommodate the data in a particular page buffer. According to another embodiment of the present invention, the compressed data is not decompressed when additional page buffers are allocated and the data is inserted into the individual page buffers. According to another embodiment of the present invention, the page data is completely decompressed before being allocated to individual page buffers. According to yet another embodiment of the present invention, the size of the pages in the sub-storage are fixed and the compression plug-in determines whether the size of the compressed data is larger than the sized of the fixed sized pages.

Figure 6:
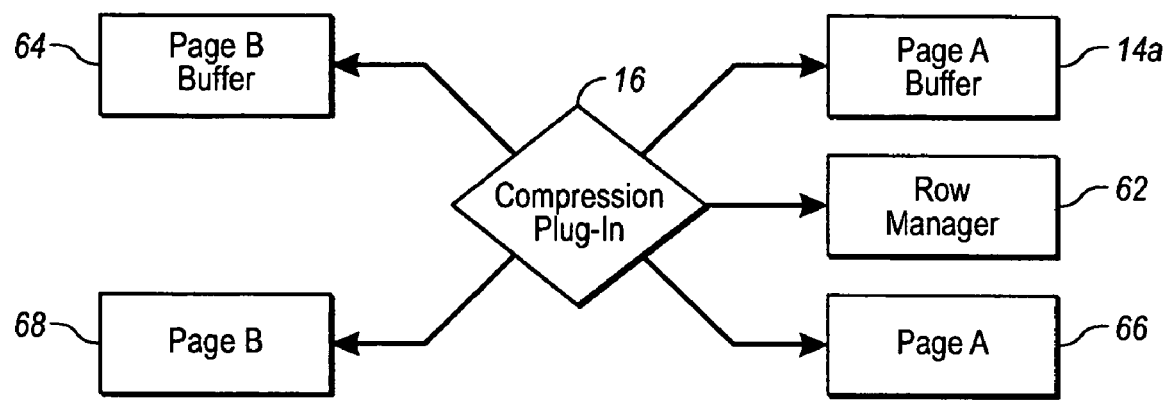
FIG. 6 is a block diagram illustrating the manner in which the compression plug-in utilizes additional page buffers to more efficiently write data to additional pages in sub-storage.

FIG. 6 is a block diagram illustrating the manner in which compression plug-in 16 utilizes additional page buffers to more efficiently transfer data to additional pages in sub-storage. In the illustrated embodiment, compression plug-in has identified that the size of the Page A 66 in sub-storage was insufficient to accommodate the data originally retrieved from Page A 66 in combination with the new data added to the data retrieved from Page A 66. As a result, compression plug-in 16 has allocated an additional page buffer 64 in addition to page buffer 14. An additional page (i.e. Page B 66) has been allocated which corresponds with page buffer 64. The combination of Page B 68 and Page A 66 provide sufficient space for the compressed data which needs to be stored.

Once page buffer 64 has been allocated, the data is allocated to Page A Buffer 14a and Page B Buffer 64 using row manager 62. Utilizing row manager 62 allows for the organized and efficient storage of the data in individual page buffers (i.e. Page A Buffer 14 and Page B Buffer 64). Once the data has been allocated to Page A Buffer 14a and Page B Buffer 64, the data is individually retrieved from each Page of Page A Buffer 14a and Page B Buffer 64, compressed using inter-row compression, and sent for storage to Page A 66 and Page B 68.

For example, according to one embodiment of the present invention, subsequent to allocation of the inter-row decompressed data to Page A Buffer 14a and Page B Buffer 64, compression plug-in 16 accesses data from Page A Buffer 14a. Compression plug-in 16 then compresses the data from Page A Buffer 14a utilizing inter-row compression. Once the data from Page A Buffer 14a is intra-row and inter-row compressed, compression plug-in confirms that there is sufficient space in Page A 66 to store the compressed data. The compressed data from Page A Buffer 14a is then sent to Page A 66 in sub-storage. Compression plug-in 16 then access the data from Page B compresses the data using inter-row compression, confirms that there is sufficient storage space in Page B 68, and sends the compressed data to Page B in sub-storage.

According to one embodiment of the present invention, if the compression plug-in cannot fit the data from the page buffer into the corresponding page in sub-storage, the compression plug-in indicates the condition to the row manager. The row manager system handles the condition by assigning one or more additional page buffers in the sub-storage, updating the relevant information in the row manager system, and then telling the compression plug-in to "split" the data in the page buffer into multiple page buffers. When splitting the page buffer, the compression plug-in may try to balance the data relatively equally in each page buffer, as appropriate. Notwithstanding the allocation system used to store data, each page buffer contains the rows of assigned data having intra-row compression applied thereto.

As will be appreciated by those skilled in the art, a variety of types and configurations of systems and methods can be utilized to allocate additional storage without departing from the scope and spirit of the present invention. For example, according to one embodiment of the present invention, more than one additional page buffers and/or pages in sub-storage are allocated based on the size of the compressed data that needs to be stored. According to another embodiment of the present invention, only a single additional page buffer and sub-storage page set is initially provided. After splitting the compressed data into the page buffers and recompressing the data from the individual pages, it is then determined whether additional page buffers and pages in sub-storage are needed. According to one embodiment of the present invention, the manner in which data is allocated to individual page buffers is tailored to the type of data to be stored.

As will be appreciated by those skilled in the art, systems in accordance with the present invention can provide benefits to many commercial database systems. For example, one benefit provided by the present invention allows the user of those systems to more specifically identify what type of data is being stored so that the database system could compress the rows more effectively. Another benefit is for allowing the user to directly specify the compression format to use when storing the rows. Furthermore, some frequently used data types (such as indexes) can be tailored by the database system itself, and can greatly improve performance and storage requirements for indexes, for example full-text indexes, while retaining their flexibility for storing large amounts of dynamic data.

In an alternative implementation of the present invention, the page buffer may be split only into two page buffers to accommodate extra data, and may also be split more flexibly into additional page buffers, as appropriate. Furthermore, data can be allocated relatively unevenly, into each of the one, two, or three (etc.) additional buffers. For example, the compression plug-in can distribute the items in the specified page buffers into the corresponding specified pages in the proportions specified, such that 15% of the data is allocated to the first page, 70% of the data is allocated in the next page, and 15% of the data is allocated in the last page. These sorts of variations can depend on user preferences, or even the configuration of the row management system (or B-Tree database system).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

I claim:

1. In a computerized database system, a computer program product having computer-executable instructions stored thereon that, when executed, perform a method of compressing an ordered sequence of structurally similar data items in a collection into one or more fixed-size storage pages, the method comprising:

distributing data in a manner that allows subsequent processing, based on parts of the data item that are unique and from which an order in the sequence can be determined, to find any particular data item without reading any of the storage pages other than the page where the data of the item is located, while also allowing the insertion of new data items in the collection and removal of data items from the collection by reading and rewriting a small subset of the storage pages and possibly adding one or more new pages to the set of pages used by the collection, the set of pages being stored in an external list;

establishing for each page a corresponding intermediate buffer where the data items stored on that page are represented in a decompressed form, the decompressed form being one of a fully decompressed form or a partially decompressed form, and when the data on a page is needed for reading, insertions, or deletions, the corresponding intermediate buffer is found in cache or created as the page data is being read;

if inserting an item into the collection, reading the intermediate buffer corresponding to the page where it would be located as described in the acts of locating pages and configuring each page, after which the item is inserted into the intermediate buffer in the appropriate sequence;

if removing an item from the collection, reading the intermediate buffer corresponding to the page where it would be located as described in the acts of locating pages and establishing intermediate buffers, after which the item is removed from the intermediate buffer;

if no data items are found in the intermediate buffer after processing the intermediate buffers that have been altered, removing the corresponding page from the list;

if the data can be compressed into a single page, recompressing the intermediate buffer into a single page; and if the data cannot be compressed into a single page, splitting the intermediate buffer into a plurality of intermediate buffers, each corresponding to a page in the list.

2. The method as recited in claim 1, wherein the act of recompressing the intermediate buffer further comprises recompressing the intermediate buffer into the page from which the data was originally read.

3. The method as recited in claim 1, further comprising configuring the pages to include links to associate one page to another, allowing sequential access to the data items.

4. The method as recited in claim 1, further comprising storing a list of the identifying parts of one data item and an identifier for its corresponding page comprising the collection using a recursive algorithm.

5. The method as recited in claim 1, wherein the external list is implemented as an array, a binary tree, a B-Tree, a B+Tree, linked-list, a list of the type being described, or a combination thereof.

6. The method as recited in claim 1, wherein the act of splitting the intermediate buffer further comprises splitting the intermediate buffer into new intermediate buffers, at least one of which corresponds to the page from which the original intermediate buffer was read.

7. The method as recited in claim 1, wherein the act of splitting the intermediate buffer further comprises splitting the intermediate buffer into new intermediate buffers, none of which correspond to the page from which the original intermediate buffer was read.

8. A computerized information retrieval and storage system for accessing data from a B-Tree or B+Tree database and storing new data in the B-tree database structure such that the ordered sequence of structurally similar items stored in the B-Tree are compressed such that the fixed-size pages that provide advantages to B-trees are retained, the computerized information retrieval and storage system comprising:

a storage containing fixed-size B-Tree pages, leaf pages of the fixed-size B-Tree pages each contain a compressed form of a number of adjacent items in the sequence, and node pages of the fixed-size B-Tree each contain a compressed form of one item from each of the corresponding leaf pages, and a root page which may be either a leaf page or a node page;

a page buffer for each B-Tree page, the page buffer being large enough to hold the items represented in the corresponding page in a partially or fully decompressed form, such that each item can be accessed individually, without having to decompress data from other items in the buffer;

the page buffer being used to store newly inserted items in addition to previously-existing items, with B-Tree page splitting being determined not at item insertion time, but rather when the page buffer is recompressed in preparation to flush the buffer to the B-Tree page storage;

the page buffer being used to store the remaining previously-existing items, with B-Tree page merging being determined not at item removal time, but rather when the page buffer is recompressed in preparation to flush the buffer to the B-Tree page storage;

if the page buffer cannot be compressed into a single B-Tree page, the corresponding B-Tree page is split into a plurality of pages, with the page buffer being split into a corresponding number of page buffers;

if the page buffer is empty or nearly empty, the corresponding B-Tree page is merged with other B-Tree pages, with the page buffer also being merged with the page buffers corresponding to the B-Tree pages with which the original B-Tree page was merged; and a specialized compression plug-in configured to determine when the buffer cannot be compressed into a single B-Tree page.

9. The system as recited in claim 8, wherein the act of recompressing the intermediate buffer further comprises recompressing the intermediate buffer into the page from which the data was originally read.

* * * * *